United States Patent
Pan et al.

(10) Patent No.: US 8,572,456 B1
(45) Date of Patent: Oct. 29, 2013

(54) AVOIDING INTERLEAVER MEMORY CONFLICTS

(75) Inventors: Zhengjun Pan, High Wycombe (GB); Volker Mauer, Princes Risborough (GB)

(73) Assignee: Altera Corporation, San Jose, CA (US)

( * ) Notice: Subject to any disclaimer, the term of this patent is extended or adjusted under 35 U.S.C. 154(b) by 1048 days.

(21) Appl. No.: 12/470,959

(22) Filed: May 22, 2009

(51) Int. Cl.
*H03M 13/00* (2006.01)

(52) U.S. Cl.
USPC .......................................................... 714/755

(58) Field of Classification Search
USPC .......................................................... 714/755
See application file for complete search history.

(56) References Cited

U.S. PATENT DOCUMENTS

| | | | |
|---|---|---|---|
| 6,714,553 B1* | 3/2004 | Poole et al. | 370/412 |
| 2006/0268913 A1* | 11/2006 | Singh et al. | 370/412 |
| 2007/0011559 A1* | 1/2007 | Cioffi et al. | 714/755 |
| 2007/0255847 A1* | 11/2007 | Smith | 709/231 |
| 2008/0307291 A1* | 12/2008 | Hoffman et al. | 714/784 |

* cited by examiner

*Primary Examiner* — Albert Decady
*Assistant Examiner* — Enam Ahmed
(74) *Attorney, Agent, or Firm* — Mauriel Kapouytian Woods LLP; Avavat Kapouytian

(57) ABSTRACT

Interleaving and deinterleaving schemes for operating in parallel on sections of a data block to load memories with respective segments of a reordered version of the block, in a manner which can avoid memory conflicts.

19 Claims, 4 Drawing Sheets

AVOIDING INTERLEAVER MEMORY CONFLICTS

BACKGROUND

The invention relates to the interleaving of data signals.

In modern telecommunications systems, it is typical for a digital signal to be transmitted in an interleaved form to protect it against errors that might appear in the received version of the signal. Commonly, a digital signal is structured as a series of modulation symbols arranged in a series of blocks, with interleaving being applied to each of the blocks separately. In this context, interleaving amounts to a reordering of the symbols within a block, in accordance with a predetermined algorithm. The interleaving can be undone or reversed through "deinterleaving" conducted at the receiver that acquires the transmitted signal.

Interleaving and deinterleaving are used within turbo decoders. FIG. 1 illustrates a field programmable gate array (FPGA) 10 implementing a turbo decoder 12 compliant with the 3GPP (Third Generation Partnership Project) UMTS (Universal Mobile Telephone System) standards. The turbo decoder 12 comprises two constituent decoders 14 and 16, two memories 18 and 20, an interleaver 22 and a deinterleaver 24.

In operation, the turbo decoder 12 will perform a number of iterations of a decoding cycle upon a block of (estimated) modulation symbols arriving in a received transmission. A block of modulation symbols that is presently being decoded shall be referred to henceforth as the "block being decoded" or the BBD. In an iteration of the decoding cycle, two sequences of operations are performed in parallel.

In the first sequence, a set of extrinsic information for the interleaved version of the BBD is iterated. Henceforth, the set of extrinsic information for the interleaved version of the BBD shall be called the "interleaved extrinsic information block" or the IEIB. In the second sequence, a set of extrinsic information for the deinterleaved version of the BBD is iterated. Henceforth, the set of extrinsic information for the deinterleaved version of the BBD shall be called the "deinterleaved extrinsic information block" or the DEIB.

In the first sequence, an iteration of the IEIB is taken from memory 20 and is used by constituent decoder 16 in conjunction with an interleaved version of the BBD to produce a new iteration of the IEIB. The constituent decoder 16 uses, for example, a max log MAP (maximum a posteriori) algorithm to produce the new iteration of the IEIB. The new iteration of the IEIB is then deinterleaved by deinterleaver 24 and stored into memory 18 as a new iteration of the DEIB.

In the second sequence, an iteration of the DEIB is taken from memory 18 and is used by constituent decoder 14 in conjunction with an deinterleaved version of the BBD to produce a new iteration of the DEIB. The constituent decoder 14 uses, for example, a max log MAP algorithm to produce the new iteration of the DEIB. The new iteration of the DEIB is then interleaved by interleaver 22 and stored into memory 20 as a new iteration of the IEIB.

The reordering process performed by the interleaver 22 is the reverse of the reordering process that is performed by the deinterleaver 24. FIG. 2 illustrates the reordering process that is performed by the interleaver 22. FIG. 2 illustrates a block 26 that is an iteration of the DEIB that is to be interleaved using interleaver 22 and the block 28 that results from this interleaving operation and which is an iteration of the IEIB. The position of the first data item in block 26 is indicated 30 and the position of the first data item in the second half of that block is indicated 32. The division between the halves of block 26 is shown by a dashed line. Assume now that the interleaving algorithm practised by interleaver 22 moves the content of position 30 to position 36 and that it moves the content of position 32 to position 34. These write operations are indicated 33 and 35, respectively.

In order to increase the data throughput of the turbo decoding process, faster hardware could be used or parallel processing could be introduced to the hardware that performs the two sequences of operations within the decoding cycle. Assume now that the latter option is taken and that constituent decoders 14 and 16 are each replaced by a pair of parallel decoders. Further, assume that, in a single iteration of the decoding cycle, each decoder in the pair replacing constituent decoder 14 iterates a separate half of the DEIB. Likewise, assume that, in a single iteration of the decoding cycle, each decoder in the pair replacing constituent decoder 16 operates on a separate half of the IEIB.

The decoders within each pair operate on their respective halves of the DEW or, as the case may be, the IEIB in order to produce new iterations of those halves. This requires the interleaver 22 to be restructured to accept two separate halves of an iteration of the DEIB and in response supply that extrinsic information reformatted as an iteration of the IEIB, but again divided into two separate halves. Likewise, it requires the deinterleaver 24 to be restructured to accept two separate halves of an iteration of the IEIB and in response supply that extrinsic information reformatted as an iteration of the DEIB but again divided into two separate halves. FIG. 3 illustrates the reordering process that will be performed by the restructured interleaver.

FIG. 3 illustrates the same block 26 that was shown in FIG. 2, and the same two locations 30 and 32 within that block. It will be apparent that locations 30 and 32 now lie in separate halves of an iteration of the DEIB. The block to which this extrinsic information is sent is now split into two halves, 38 and 40. Since the interleaving algorithm has not changed at the block level, the content of locations 30 and 32 are still mapped to locations 34 and 36. However, both of the locations 34 and 36 now lie in the first half 38.

Assume now that the restructured interleaver attempts to create the halves 38 and 40 simultaneously by processing the two halves of block 26 in parallel. Under such circumstances, the restructured interleaver will attempt to write the contents of locations 30 and 32 into half 38 simultaneously. Assume now that the halves of block 26 and the two halves 38 and 40 occupy separate memory blocks within the FPGA 10 and that, as is usual, data can only be written serially to these memory blocks. Given that half 38 is within a single memory block it is therefore not possible to perform the write operations 33 and 35 simultaneously with the result that the restructured interleaver cannot operate.

SUMMARY

According to one aspect, an embodiment of the invention provides an interleaving system suitable for a turbo decoder. This system includes a plurality of interleavers, each arranged to address data items from a respective section of a block of data items with destinations in segments of an interleaved version of that block. A respective set of first-in, first-out buffers (hereinafter "FIFOs") is provided for each interleaver, each set containing a plurality of FIFOs, each associated with a respective one of the segments to which the respective interleaver can address data items. A plurality of memories is provided, each for a respective one of the segments. Also included is a router arranged to direct into each FIFO data items addressed to the memory associated with the FIFO by the interleaver associated with the FIFO and arranged to direct into each memory only data items from the FIFOs associated with the memory.

According to another aspect, an embodiment of the invention provides a deinterleaving system suitable for a turbo decoder. This system includes a plurality of deinterleavers, each arranged to address data items from a respective section of an interleaved version of a block of data items with destinations in segments of a deinterleaved version of that block. A respective set of FIFOs is provided for each deinterleaver, each set containing a plurality of FIFOs, each associated with a respective one of the segments to which the respective deinterleaver can address data items. A plurality of memories is provided, each for a respective one of the segments. Also included is a router arranged to direct into each FIFO data items addressed to the memory associated with the FIFO by the deinterleaver associated with the FIFO and arranged to direct into each memory only data items from the FIFOs associated with the memory.

By using FIFOs to queue the data items for the memories, write conflicts between outputs of the interleavers or, as the case may be, deinterleavers can be avoided.

In certain embodiments, the router comprises a respective demultiplexer for each interleaver (or, as the case may be, deinterleaver), each demultiplexer being arranged to route data items from its respective demultiplexer to the set of FIFOs of that interleaver (or, as the case may be, deinterleaver).

In certain embodiments, each interleaver (or, as the case may be, deinterleaver) is arranged to deduce for a data item a first address component indicating the segment to which the data item should be consigned. In certain embodiments, the router comprises a respective demultiplexer for each interleaver (or, as the case may be, deinterleaver), each demultiplexer being arranged to route data items from its respective demultiplexer to the set of FIFOs of that interleaver (or, as the case may be, deinterleaver). Moreover, each demultiplexer can be arranged to route a data item from its respective interleaver (or, as the case may be, deinterleaver) to a FIFO in the respective set on the basis of the first address component of the data item.

In certain embodiments, each interleaver (or, as the case may be, deinterleaver) is arranged to deduce for a data item a second address component indicating a position that the data item should adopt in the segment to which the data item is to be assigned. In certain embodiments, each interleaver (or, as the case may be, deinterleaver) joins each data item to its second address component for loading into one of the FIFOs as a packet.

In certain embodiments, the router comprises a respective multiplexer for each memory, each multiplexer being arranged to multiplex into its respective memory data items loaded into those FIFOs that are associated with that memory.

According to another aspect, an embodiment of the invention provides an interleaving system suitable for a turbo decoder. This system includes a plurality of interleavers, each arranged to address data items from a respective section of a block of data items with destinations in segments of an interleaved version of that block. Each interleaver has a set of output queues for holding data items destined for different segments. Also included is a router for directing the contents of the queues into their respective segments. The router is arranged to direct data items from the queues into a given segment serially.

According to another aspect, an embodiment of the invention provides a deinterleaving system suitable for a turbo decoder. This system includes a plurality of deinterleavers, each arranged to address data items from a respective section of an interleaved version of a block of data items with destinations in segments of an deinterleaved version of that block. Each deinterleaver has a set of output queues for holding data items destined for different segments. Also included is a router for directing the contents of the queues into their respective segments. The router is arranged to direct data items from the queues into a given segment serially.

In certain embodiments, the segments can be quarters of the block (or, as the case may be, the interleaved version of the block). Likewise, the sections can be quarters Of the interleaved version of the block (or, as the case may be, the deinterleaved or "plain" version of the block). Typically, there are as many sections are there are interleavers (or, as the case may be, deinterleavers).

An interleaving or deinterleaving system according to the invention can be deployed in, for example, a turbo decoder, in which case the data items that are re-ordered may be one or more sets of extrinsic information associated with the turbo decoding process. Such a turbo decoder can be deployed in, for example, a radio communications network base station (e.g., a UMTS base station).

An interleaving system according to the invention can be hosted in a FPGA. It could also be implemented in, for example, an application specific integrated circuit.

BRIEF DESCRIPTION OF THE DRAWINGS

The novel features of the invention are set forth in the appended claims. However, for purpose of explanation, several aspects of particular embodiments of the invention are described by reference to the following figures.

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
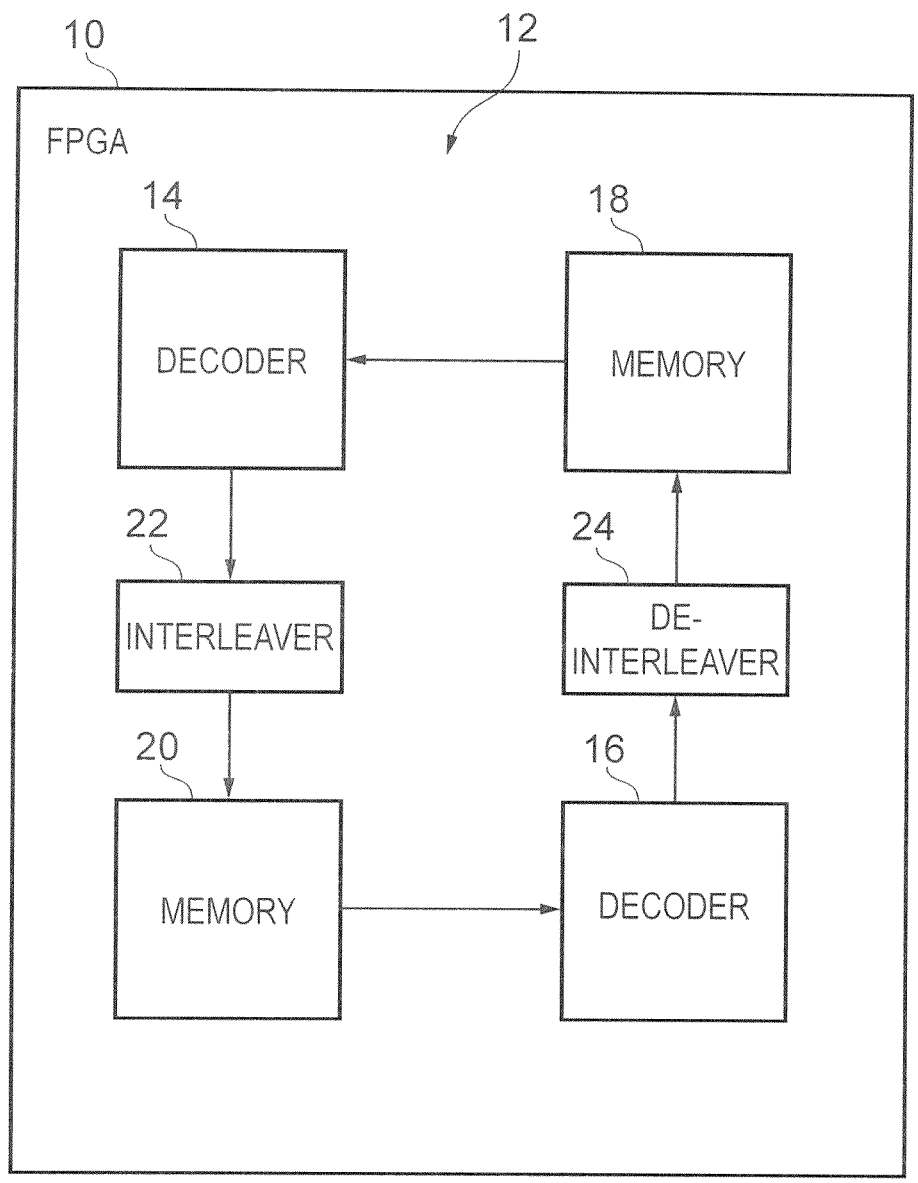
FIG. 1 is a schematic block diagram of a FPGA implementing a known turbo decoder.
Figure 2:
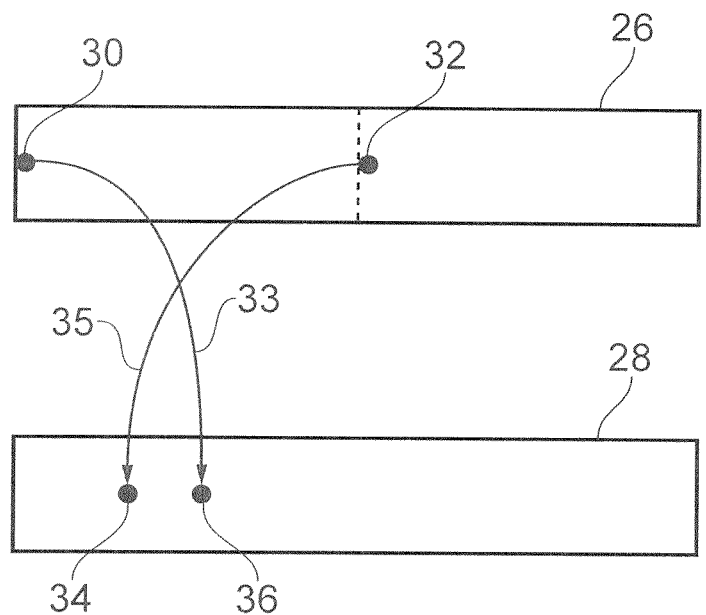
FIG. 2 is a schematic illustration of an interleaving process in the turbo decoder of FIG. 1.
Figure 3:
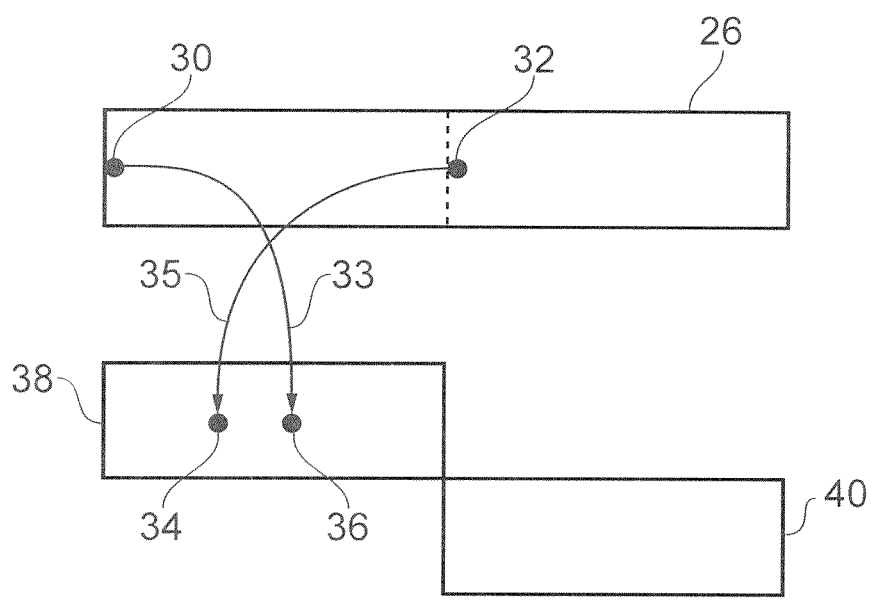
FIG. 3 is a schematic illustration of an interleaving process in a variant of the turbo decoder of FIG. 1.
Figure 4:
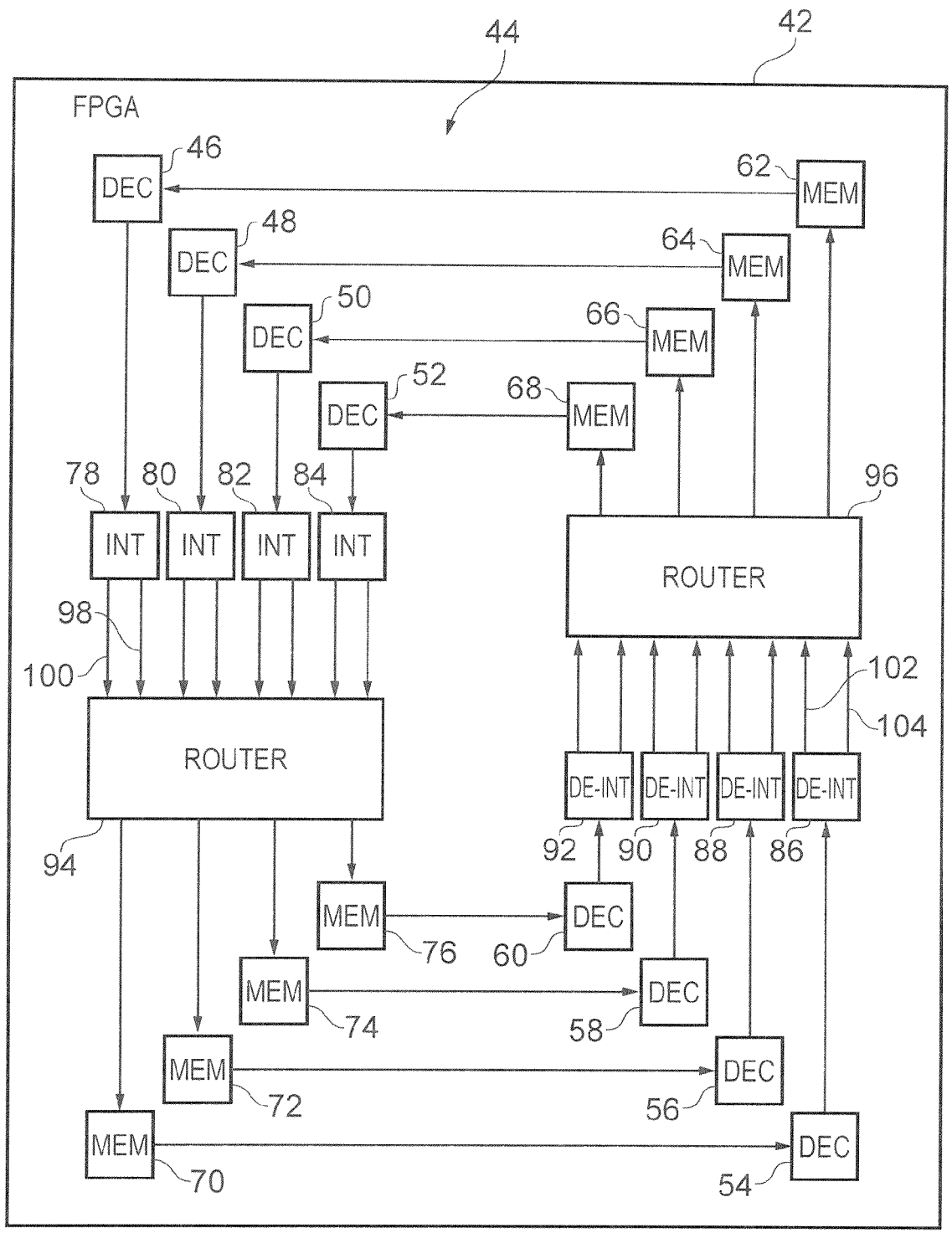
FIG. 4 is a schematic block diagram of a radio communications network base station including an FPGA implementing a turbo decoder according to an embodiment of the present invention.

Earlier, a parallelised form of turbo decoder 12 was discussed, in which the constituent decoders 14 and 16 were each replaced with a pair of parallel decoders. FIG. 4 illustrates a radio communications network base station 41 including an FPGA 42 in which is implemented a turbo decoder 44 that is a version of turbo decoder 12 in which the constituent decoders 14 and 16 have each been replaced with a quartet of parallel decoders.

Referring now to FIG. 4 in more detail, within the FPGA 42, there is implemented a first quartet of decoders 46 to 52, a second quartet of decoders 54 to 60, a first quartet of memory blocks 62 to 68, a second quartet of memory blocks 70 to 76, a quartet of interleavers 78 to 84, a quartet of deinterleavers 86 to 92 and two routers 94 and 96.

As before, the block of estimated modulation symbols that is currently undergoing turbo decoding will be referred to as the BBD, the set of extrinsic information for the interleaved version of the BBD will be referred to as the IEIB and the set of extrinsic information for the deinterleaved version of the BBD will be referred to as the DEIB.

The turbo decoder 44 is designed to implement a decoding cycle on the BBD. This decoding cycle comprises two sequences of operations that are performed in parallel. One of these sequences shall be called the "deinterleaved decoding sequence" or DDS, and the other one shall be called the "interleaved decoding sequence", or IDS.

The DDS is carried out by decoders 46 to 52, interleavers 78 to 84 and router 94. In the DDS, an iteration of the DEIB is retrieved from memory blocks 62 to 68, processed by decoders 46 to 52 to produce a new iteration of the DEIB which is then interleaved by interleavers 78 to 84 and written into memory blocks 70 to 76 by the router 94.

The IDS is carried out by decoders 54 to 60, deinterleavers 86 to 92 and router 96. In the IDS, an iteration of the IEIB is retrieved from memory blocks 70 to 76, processed by decoders 54 to 60 to produce a new iteration of the IEIB which is then deinterleaved by deinterleavers 86 to 92 and written into memory blocks 62 to 68 by the router 96.

There is a further degree of parallelism in turbo decoder 44 in that there are four tracks that perform processing in parallel. The first track is from element 46, through elements 78, 94, 70, 54, 86, 96 and 62 and back to element 46. The second track is from element 48, through elements 80, 94, 72, 56, 88, 96 and 64 and back to element 48. The third track is from element 50, through elements 82, 94, 74, 58, 90, 96 and 66 and back to element 50. The fourth track is from element 52, through elements 84, 94, 76, 60, 92, 96 and 68 and back to element 52.

During an iteration of the decoding cycle, each of these tracks processes a quarter of the IEIB and a quarter of the DEIB. First through fourth quarters of an iteration of the DEIB are stored in memory blocks 62 to 68, respectively. Similarly, first through fourth quarters of an iteration of the IEIB are stored in memory blocks 70 to 76, respectively. The processing performed in each track follows the same general algorithm. Therefore, in the interests of brevity and clarity, only the processing within the first track will now be described, it being understood that the processing that is performed in the second to fourth tracks follows the same general plan.

The participation of the first track in the DDS will now be described.

Decoder 46 is supplied serially with the first quarter of an iteration of the DEIB from memory block 62 and processes it using a max log MAP algorithm to produce a new iteration of that quarter. That new iteration of the first quarter of DEIB is then supplied to interleaver 78.

Interleaver 78 calculates a two part destination for each element of the new iteration of the first quarter of the DEIB that is received from decoder 46. The first part, which shall be known as a "block address", is a signal indicating the identity of the quarter of the IEIB in which the element should lie according to the block-level interleaving algorithm and the second part, which shall be known as an "intra-block address", is the position that the element should, again in accordance with the block-level interleaving algorithm, occupy within that quarter of the IEIB. For each element of the new iteration of the first quarter of the DEIB, the interleaver 78 transmits a concatenation of the element and its calculated intra-block address, hereinafter called a "relatively addressed packet" or RAP, to the router 94 over connection 98 and in parallel transmits the calculated block address of the element to router 94 over connection 100.

The router 94 operates across all four tracks but, insofar as the first track is concerned, it sequentially writes elements of extrinsic information as received from the four interleavers 78 to 84 into the correct locations within memory block 70 to assemble therein the first quarter of a new iteration of the IEIB. The operation of the router 94 will be described in more detail later.

Thus, the contribution of the first track to the DDS is the retrieval of the first quarter of the DEIB from memory 62, the iteration of that quarter using decoder 46, the determination of destinations of the elements of the iterated quarter using the interleaver 78 and, through the action of router 94, the assembly in memory block 70 of the first quarter of a new iteration of the IEIB based on the outputs of the four interleavers 78 to 84. Likewise, the second, third and fourth tracks participate in the DDS by iterating respective second, third and fourth quarters of the DEIB and assembling in respective memories 72 to 76 second, third and fourth quarters, respectively, of a new iteration of the IEIB.

Next, the participation of the first track in the IDS will be described.

Decoder 54 is supplied serially with the first quarter of an iteration of the IEIB from memory block 70 and processes it using a max log MAP algorithm to produce a new iteration of that quarter. That new iteration of the first quarter of the IEIB is then supplied to deinterleaver 86.

Deinterleaver 86 calculates a two part destination for each element of the new iteration of the first quarter of the IEIB that is received from decoder 54. The first part, which shall be known as a "block address", is a signal indicating the identity of the quarter of the DEIB in which the element should lie according to the block-level deinterleaving algorithm and the second part, which shall be known as an "intra-block address", is the position that the element should, again in accordance with the block-level deinterleaving algorithm, occupy within that quarter of the DEIB. For each element of the new iteration of the first quarter of the IEIB, the deinterleaver 86 transmits a concatenation of the element and its calculated intra-block address, hereinafter called a "relatively addressed packet" or RAP, to the router 96 over connection 102 and in parallel transmits the calculated block address of the element to router 96 over connection 104.

The router 96 operates across all four tracks but, insofar as the first track is concerned, it sequentially writes elements of extrinsic information as received from the four deinterleavers 86 to 92 into the correct locations within memory block 62 to assemble therein the first quarter of a new iteration of the DEIB. The operation of the router 96 will be described in more detail later.

Thus, the contribution of the first track to the IDS is the retrieval of the first quarter of the IEIB from memory 70, the iteration of that quarter using decoder 54, the determination of destinations of the elements of the iterated quarter using the deinterleaver 86 and, through the action of router 96, the assembly in memory block 62 of the first quarter of a new iteration of the DEIB based on the outputs of the four deinterleavers 86 to 92. Likewise, the second, third and fourth tracks participate in the IDS by iterating respective second, third and fourth quarters of the IEIB and assembling in respective memories 64 to 68 second, third and fourth quarters, respectively, of a new iteration of the DEIB.

Now that the DDS and IDS have been discussed, the operation of router 94 will now be described in more detail with reference to FIG. 5.

Figure 5:
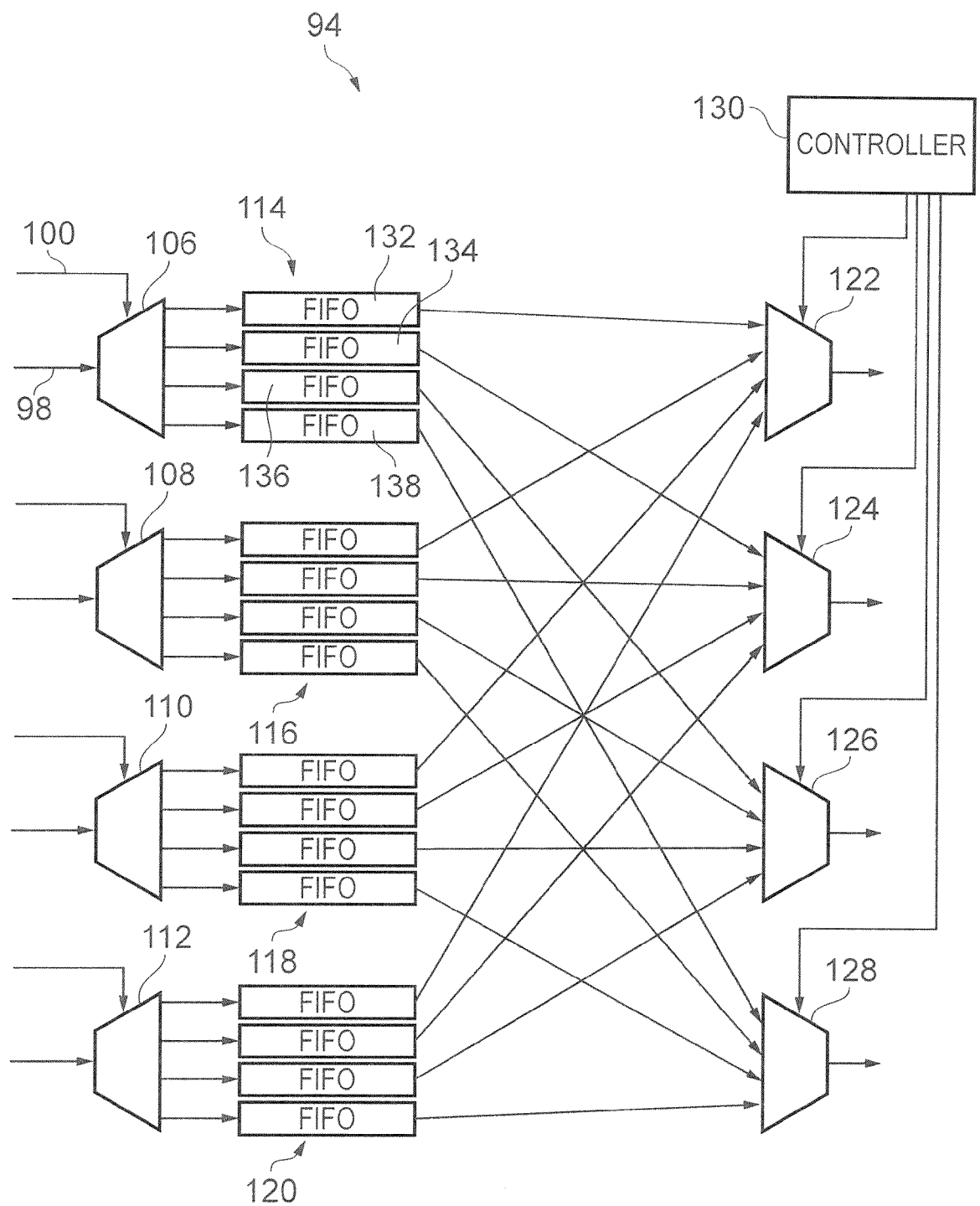
FIG. 5 is a schematic block diagram of a router within the turbo decoder of FIG. 4.

As shown in FIG. 5, the router 94 comprises four demultiplexers 106 to 112, four quartets of FIFOs 114 to 120, four multiplexers 122 to 128 and a controller 130.

The demultiplexers 106 to 112 are supplied, respectively, with the pairs of parallel block address and RAP streams from interleavers 78 to 84. The RAP stream of a pair becomes the data input to the pair's respective demultiplexer and the block address stream of that pair becomes the control input to that demultiplexer. For example, connection 98 feeds the RAP stream from interleaver 78 into demultiplexer 106 as a data input and connection 100 delivers the block address stream from interleaver 78 to the control input of that demultiplexer. The demultiplexers 106 to 112 are controlled by block addresses arriving at their control inputs to distribute RAPs to the FIFOs in respective FIFO quartets 114 to 120.

In each FIFO quartet 114 to 120, the FIFO shown uppermost is for receiving RAPs for the first quarter of the IEIB, the FIFO below that is for receiving RAPs for the second quarter of the IEIB, the FIFO below that is for receiving RAPs for the third quarter of the IEIB and the FIFO below that is for receiving RAPs for the fourth quarter of the IEIB. Hence, in a FIFO quartet, the FIFO shown uppermost shall be known as the "first quarter FIFO", the FIFO below that shall be known as the "second quarter FIFO", the FIFO below that shall be known as the "third quarter FIFO" and the bottom FIFO shall be known as the "fourth quarter FIFO". For example, FIFOs 132 to 138 are, respectively, the first to fourth quarter FIFOs of the FIFO quartet 114 that receives RAPs from interleaver 78. Each of the sixteen FIFOs across the four quartets has a respective occupancy flag having a queued state, which indicates the presence of RAPs in that FIFO, and an empty state, which indicates the absence of RAPs in that FIFO.

When a RAP is delivered to the data input of demultiplexer 106 on connection 98, the corresponding block address is delivered in parallel to the control input of the demultiplexer on connection 100. The demultiplexer responds to the block address to route the RAP into the correct FIFO. For example, if a block address indicates that a corresponding RAP is destined for the third quarter of the IEIB, then the demultiplexer 106 will respond by routing the RAP into the third quarter FIFO 136. Demultiplexers 108 to 112 route their RAPs in the same manner.

The contents of the FIFO quartets are read out by the multiplexers 122 to 128. Multiplexer 122 takes RAPs from the four FIFOs across the four FIFO quartets 114 to 120 that contain RAPs for the first quarter of the IEIB (i.e., from the four first quarter FIFOs) and outputs them to memory block 70. Multiplexer 124 takes RAPs from the four FIFOs across the four FIFO quartets 114 to 120 that contain RAPs for the second quarter of the IEIB (i.e., from the four second quarter FIFOs) and outputs them to memory block 72. Multiplexer 126 takes RAPs from the four FIFOs across the four FIFO quartets 114 to 120 that contain RAPs for the third quarter of the IEIB (i.e., from the four third quarter FIFOs) and outputs them to memory block 74. Multiplexer 128 takes RAPs from the four FIFOs across the four FIFO quartets 114 to 120 that contain RAPs for the fourth quarter of the IEIB (i.e., from the four fourth quarter FIFOs) and outputs them to memory block 76.

The multiplexers 122 to 128 are controlled by the controller 130. The controller 130 controls multiplexer 122 in the following way.

The controller 130 monitors the occupancy flags of the four first quarter FIFOs. Within a given output cycle of the multiplexer 122, the controller 130 will check the occupancy flags of the four first quarter FIFOs in turn, commencing with FIFO 132, and will direct the multiplexer 122 to transmit to memory block 70 a RAP from the first FIFO that it encounters whose occupancy flag is set to the queued state. Of course, if all four occupancy flags happen to be set to the empty state, then no RAP is available for transmission to memory block 70 in the current multiplexer output cycle.

The controller 130 controls multiplexers 124 to 128 in an analogous manner by reference to their respective quartets of occupancy flags.

Upon delivery of a RAP to memory block 70 from multiplexer 122, control circuitry associated with that memory block is arranged to write the element of extrinsic information contained in the RAP to the address in that memory block that is specified by the intra-block address contained in the RAP. Memory blocks 72 to 76 are arranged to respond in an analogous fashion to the RAPs that they receive from their respective multiplexers 124 to 128.

Thus, router 94 operates to avoid memory conflicts in write operations to memory blocks 70 to 76. It will also be understood that the design of router 96 is analogous to that of router 94 but is tailored to use demultiplexers, FIFOs and multiplexers to route RAPs from deinterleavers 86 to 92 to the correct destinations within memory blocks 62 to 68.

While the present invention has been particularly described with respect to the illustrated embodiments, it will be appreciated that various alterations, modifications and adaptations may be made based on the present disclosure, and are intended to be within the scope of the present invention. As simple examples, we offer the observations that the constituent decoders could iterate their assigned fractions of the DEIB (or the IEIB) using an algorithm other than the max log MAP algorithm (such as a MAP or log MAP algorithm), the turbo decoder could be implemented in a base other than an FPGA (such as an integrated circuit, for example, that is not an FPGA), and the number of tracks could differ from four.

While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. An interleaving system comprising:
a plurality of interleavers, each interleaver arranged to address data items from a respective section of a block of data items with destinations in segments of an interleaved version of the block;
a plurality of sets of first-in, first out buffers (FIFOs), a respective set of FIFOs for each interleaver such that each set of FIFOs is associated with a respective interleaver, each set of FIFOs containing a plurality of FIFOs, each FIFO in the respective set of FIFOs is associated with a respective one of the segments to which the respective interleaver can address data items, and the respective interleaver is associated with each FIFO in the respective set of FIFOs;
a plurality of memories, each memory for a respective one of the segments; and
a router arranged to direct into each FIFO data items addressed to a memory associated with the FIFO by the respective interleaver associated with the FIFO and arranged to direct into each memory only data items from FIFOs associated with the memory.

2. The interleaving system of claim 1, wherein:
each interleaver is arranged to deduce for a data item a first address component indicating a segment to which the data item should be consigned.

3. The interleaving system of claim 1, wherein:
each interleaver is arranged to deduce for a data item a second address component indicating a position that the data item should adopt in a segment to which the data item is to be assigned.

4. The interleaving system of claim 1, wherein:
the router comprises a plurality of demultiplexers, a respective demultiplexer for each interleaver, each demultiplexer being arranged to route data items from its respective interleaver to the set of FIFOs associated with that interleaver.

5. The interleaving system of claim 2, wherein:
the router comprises a plurality of demultiplexers, a respective demultiplexer for each interleaver, each demultiplexer being arranged to route data items from its respective interleaver to the set of FIFOs associated with that interleaver; and
each demultiplexer is arranged to route a data item from its respective interleaver to a FIFO on the basis of the first address component of the data item, wherein the FIFO is in the set of FIFOs associated with the respective interleaver.

6. The interleaving system of claim 3, wherein:
each interleaver joins each data item to its second address component for loading into one of the FIFOs as a packet.

7. The interleaving system of claim 1, wherein:
the router comprises a plurality of multiplexers, a respective multiplexer for each memory, each multiplexer being arranged to multiplex into its respective memory data items loaded into those FIFOs that are associated with that memory.

8. A turbo decoder comprising the interleaving system of claim 1.

9. A radio communications network base station including the turbo decoder of claim 8.

10. A FPGA hosting an implementation of the interleaving system of claim 1.

11. An interleaving system comprising:
a plurality of interleavers, each interleaver arranged to address data items from a respective section of a block of data items with destinations in segments of an interleaved version of the block;
a plurality of sets of first-in, first out buffers (FIFOs), a respective set of FIFOs for each interleaver such that each set of FIFOs is associated with a respective interleaver, each set of FIFOs containing a plurality of FIFOs, each FIFO in the respective set of FIFOs is associated with a respective one of the segments to which the respective interleaver can address data items, and the respective interleaver is associated with each FIFO in the respective set of FIFOs; and
a router for directing contents of the queues into their respective segments,
wherein:
the router directs data items from the queues into a given segment serially.

12. A deinterleaving system comprising:
a plurality of deinterleavers, each deinterleaver arranged to address data items from a respective section of an interleaved version of a block of data items with destinations in segments of a deinterleaved version of the block;
a plurality of sets of first-in, first-out buffers (FIFOs), a respective set of FIFOs for each deinterleaver such that each set of FIFOs is associated with a respective deinterleaver, each set of FIFOs containing a plurality of FIFOs, each FIFO in the respective set of FIFOs is associated with a respective one of the segments to which the respective deinterleaver can address data items, and the respective deinterleaver is associated with each FIFO in the respective set of FIFOs;
a plurality of memories, each memory for a respective one of the segments; and
a router arranged to direct into each FIFO data items addressed to a memory associated with the FIFO by the respective deinterleaver associated with the FIFO and arranged to direct into each memory only data items from FIFOs associated with the memory.

13. The deinterleaving system of claim 12, wherein:
each deinterleaver is arranged to deduce for a data item a first address component indicating a segment to which the data item should be consigned.

14. The deinterleaving system of claim 12, wherein:
each deinterleaver is arranged to deduce for a data item a second address component indicating a position that the data item should adopt in a segment to which the data item is to be assigned.

15. The deinterleaving system of claim 12, wherein:
the router comprises a plurality of demultiplexers, a respective demultiplexer for each deinterleaver, each demultiplexer being arranged to route data items from its respective deinterleaver to the set of FIFOs associated with that deinterleaver.

16. The deinterleaving system of claim 13, wherein:
the router comprises a plurality of demultiplexers, a respective demultiplexer for each deinterleaver, each demultiplexer being arranged to route data items from its respective deinterleaver to the set of FIFOs associated with that deinterleaver; and
each demultiplexer is arranged to route a data item from its respective deinterleaver to a FIFO on the basis of the first address component of the data item, wherein the FIFO is in the set of FIFOs associated with the respective deinterleaver.

17. The deinterleaving system of claim 14, wherein:
each deinterleaver joins each data item to its second address component for loading into one of the FIFOs as a packet.

18. The deinterleaving system of claim 12, wherein:
the router comprises a plurality of multiplexers, a respective multiplexer for each memory, each multiplexer being arranged to multiplex into its respective memory data items loaded into those FIFOs that are associated with that memory.

19. A deinterleaving system comprising:
a plurality of deinterleavers, each deinterleaver arranged to address data items from a respective section of an interleaved version of a block of data items with destinations in segments of a deinterleaved version of the block;
a plurality of sets of first-in, first-out buffers (FIFOs), a respective set of FIFOs for each deinterleaver such that each set of FIFOs is associated with a respective deinterleaver, each set of FIFOs containing a plurality of FIFOs, each FIFO in the respective set of FIFOs is associated with a respective one of the segments to which the respective deinterleaver can address data items, and the respective deinterleaver is associated with each FIFO in the respective set of FIFOs; and a router for directing contents of the queues into their respective segments, wherein:

the router directs data items from the queues into a given segment serially.

* * * * *